United States Patent
Oh et al.

(10) Patent No.: US 6,333,201 B1
(45) Date of Patent: Dec. 25, 2001

(54) METHOD FOR FABRICATING NONVOLATILE FERROELECTRIC MEMORY

(75) Inventors: Ki Young Oh, Chungcheongbuk-do; Ki Hyun Yoon, Kyungki-do, both of (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/228,552

(22) Filed: Jan. 12, 1999

(30) Foreign Application Priority Data

Jan. 14, 1998 (KR) .................................................. 98-868

(51) Int. Cl.$^7$ .................................................. H01L 21/00
(52) U.S. Cl. .............................. 438/3; 438/240; 438/253; 438/396
(58) Field of Search .................... 438/3, 240, 253, 438/396

(56) References Cited

U.S. PATENT DOCUMENTS 5,610,853 * 3/1997 Akiyama et al. ..................... 365/145

OTHER PUBLICATIONS

Furuta et al., "Shape Memory Ceramics and Their Application to Latching Relays", Sensors and Materials 3,4 (1992) pp. 205–215.*

Oh et al., "Piezoelectricity in the Field–Induced Ferroelectric Phase of Lead Zirconate–Based Antiferroelectrics" Journal of American Ceramic Soc., 75[4] Apr. 1992, pp. 795–799.*

Tatsumi Sumi et al., "FA 16.2: A 256kb Nonvolatile Ferroelectric Memory at 3V and 100 ns;" ICSCC94/Session 16/Technology Directions: Memory Packaging/Paper FA16.2; 1994 IEEE International Solid State Circuits Conference; pp. 268–269 and Slide Supplement pp. 209 & 315.

* cited by examiner

Primary Examiner—John F. Niebling
Assistant Examiner—Jennifer M. Kennedy
(74) Attorney, Agent, or Firm—Fleshner & Kim, LLP

(57) ABSTRACT

Method for fabricating a nonvolatile ferroelectric memory, is disclosed, which can prolong a life time of the memory, including the steps of forming an insulating film on a semiconductor substrate, forming a bottom electrode on the insulating film, forming a ferroelectric film on the bottom electrode, wherein the ferroelectric film is formed of a material containing zirconium oxide as a base composition, the material having an antiferroelectric phase which can not be induced to a ferroelectric phase by an electric field, and the induced ferroelectric phase exhibiting a hysteresis in polarization-electric field characteristic and unable to be induced to an antiferroelectric phase by an electric field, and forming a top electrode on the ferroelectric film.

15 Claims, 8 Drawing Sheets

PNZST 30kV/cm

PNZST 30kV/cm

METHOD FOR FABRICATING NONVOLATILE FERROELECTRIC MEMORY

BACKGROUND OF THE INVENTION

1. Field of the Invention

The present invention relates to a nonvolatile memory, and more particularly to a method for fabricating a nonvolatile ferroelectric memory which can prolong a life time of the memory.

2. Background of the Related Art

A ferroelectric memory, i.e., an FRAM(Ferroelectric Random Access Memory) is paid attention as a next generation memory which has a data processing rate as fast as a DRAM (Dynamic Random Access Memory) generally used as a semiconductor memory and retains the data even in turn off of power. The FRAM, having a structure almost identical to a DRAM, is a memory which employs a ferroelectric material as a capacitor material for utilizing a high residual dielectric polarization that is a characteristic of the ferroelectric material in retaining data even after removal of an electric field.

A related art method for fabricating a nonvolatile ferroelectric memory will be explained, with reference to the attached drawings. FIGS. 1a~1c illustrate sections showing the steps of a related art method for fabricating a capacitor of a ferroelectric material.

Referring to FIG. 1a, the steps of a related art method for fabricating a capacitor of a ferroelectric material starts with forming an insulating film 2 on a semiconductor substrate 1, and forming a bottom electrode 3 on the insulating film 2. The bottom electrode 3 is formed of Pt (Platinum). As shown in FIG. 1b, a PZT[Pb(Zr, Ti)O3]4, a ferroelectric film, is formed on the bottom electrode 3. As shown in FIG. 1c, a top electrode 5 is formed on the PZT 4. The top electrode 5 is formed of Pt.

FIG. 2 illustrates a general hysteresis loop of a ferroelectric material, and FIG. 3 illustrates P-E curves on an electric field cycle applied to the PZT used as the ferroelectric material. That is, FIG. 2 illustrates hysteresis curves of ferroelectric materials, such as PZT used for the related art memory shown in FIGS. 1a~1c. The ferroelectric material of PZT has a spontaneous polarization and a polarization inversion by an electric field, which are essential properties in the ferroelectric material. As shown in FIG. 2, the polarization induced by the electric field does not disappear, but a certain amount of residual dielectric polarization(+Pr and −Pr) is kept due to the spontaneous polarization even after the electric field is removed. The states of +Pr and −Pr are corresponded to 0 and 1 respectively in utilizing as a memory, and different from the DRAM, data can be kept even after removal of the electric field, thereby implementing the nonvolatile memory. In operation of the FRAM, i.e., in reading and writing a data, the two states of +Pr and −Pr should be alternated as necessary, from +Pr to −Pr or vice versa, which is called as a polarization inversion, which causes a degradation.

That is, as shown in FIG. 3, when a bipolar field is applied in succession to a ferroelectric film, such as of PZT, for causing a polarization inversion, a P(Polarization)-V (voltage) characteristic shows a gradual decrease of residual dielectric polarization of +Pr and −Pr as applied voltage cycles are increased until the memory can not serve as a memory, finally. FIG. 3 shows a sharp increase of a fatigue of the ferroelectric film when a number of the cycle is greater than $10^8$, which is caused by a mismatched of the ferroelectric film with an electrode material, for which researches on a new electrode material that has good match with the existing PZT is underway. FIG. 4 illustrates a graph showing fatigue of the PZT ferroelectric film, wherein a number of applied field cycles vs. residual dielectric polarization is shown in a case when PZT is used as a ferroelectric film and Pt is used for the top and bottom electrodes, wherefrom it can be known that the fatigue sharply increases at around $10^8$ switching cycles in the case of PZT.

However, the related art method for fabricating a nonvolatile ferroelectric memory has a problem in that the rapid fatigue of the ferroelectric film, such as PZT, started to occur when a number of re-writing which requires polarization inversion exceeds $10^8$ times drops a reliability of the nonvolatile ferroelectric memory.

SUMMARY OF THE INVENTION

Accordingly, the present invention is directed to a method for fabricating a nonvolatile ferroelectric memory that substantially obviates one or more of the problems due to limitations and disadvantages of the related art.

An object of the present invention is to provide a method for fabricating a nonvolatile ferroelectric memory which can prolong a life time of the nonvolatile ferroelectric memory.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a nonvolatile ferroelectric memory includes the steps of forming an insulating film on a semiconductor substrate, forming a bottom electrode on the insulating film, forming a ferroelectric film on the bottom electrode, wherein the ferroelectric film is formed of a material containing zirconium oxide as a base composition, the material having an antiferroelectric phase which can not be induced to a ferroelectric phase by an electric field, and the induced ferroelectric phase exhibiting a hysteresis in polarization-electric field characteristic and unable to be induced to an antiferroelectric phase by an electric field, and forming a top electrode on the ferroelectric film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 5A:
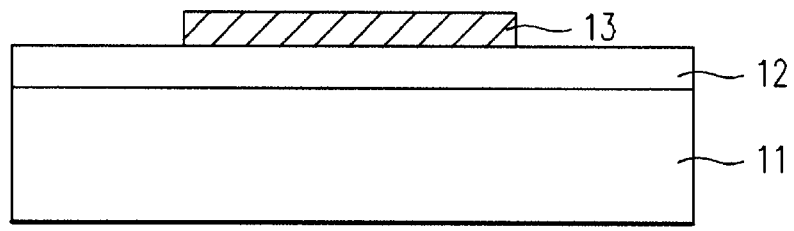
FIGS. 5a~5c illustrate sections showing the steps of a method for fabricating a capacitor of a ferroelectric material in accordance with a preferred embodiment of the present invention.
Figure 5B:
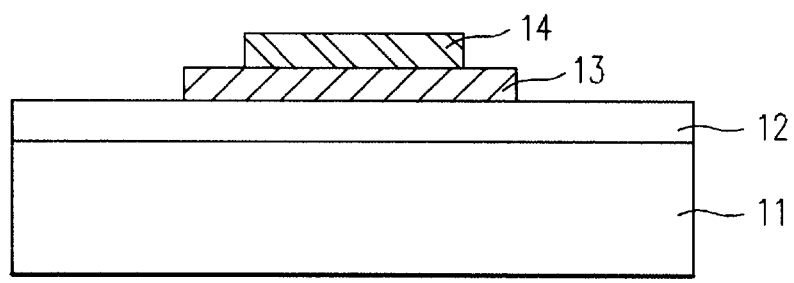
Figure 5C:
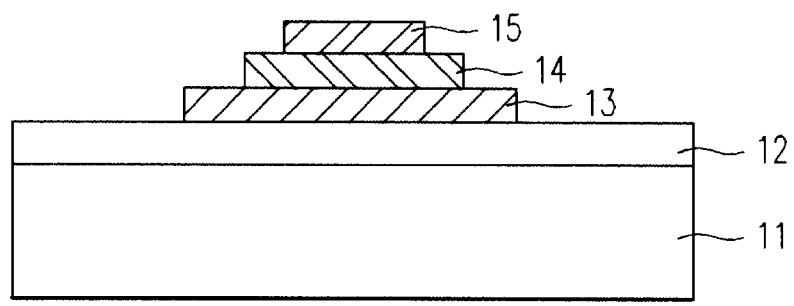

Reference will now be made in detail to the preferred embodiments of the present invention, examples of which are illustrated in the accompanying drawings. FIGS. 5a~5c illustrate sections showing the steps of a method for fabricating a capacitor of a ferroelectric material in accordance with a preferred embodiment of the present invention.

Referring to FIG. 5a, the method for fabricating a capacitor of a ferroelectric material in accordance with a preferred embodiment of the present invention starts with forming an insulating film 12 on a semiconductor substrate 11 and forming a bottom electrode 13 on the insulating film 12. The bottom electrode 13 is formed of Pt by sputtering. As shown in FIG. 5b, a ferroelectric film 14 is formed on the bottom electrode 13. The ferroelectric film 14 is formed of either PNZST(PbNb[ZrSn)Ti]$O_3$) or PZST[Pb[(ZrSn)Ti]$O_3$] by sol-gel method. The PNZST and the PZST are composed to have a typical antiferroelectric state, a state in which the antiferroelectric state and a ferroelectric state are mixed, or the ferroelectric state. The ferroelectric film 14 may be formed by sputtering or MOCVD(Metalorganic Chemical Vapor Deposition) other than the sol-gel method. And, the ferroelectric film 14 of the present invention contains PbZrO3 as a basic composition and PbSn$O_3$ and PbTi$O_3$ always. The aforementioned ferroelectric film 14 of PNZST (PbNb[ZrSn)Ti]$O_3$) or PZST[Pb[(ZrSn)Ti]$O_3$], being an antiferroelectric film originally, does not return to the antiferroelectric film once the antiferroelectric film is induced to a ferroelectric film by an electric field. Accordingly, provided the antiferroelectric film is induced into a ferroelectric film, the ferroelectric film shows a hysteresis in a P-E (Polarization-Electric field) characteristic, and can be returned to an antiferroelectric state only by heating at a temperature ranging 100~200° C. The aforementioned ferroelectric film has a ferroelectric state at a room temperature, and any one of lanthanum La, yttrium Y, tantalum Ta, and niobium Nb may be added to PNZST or PZST for preventing the PNZST or PZST from returning to an antiferroelectric state. As shown in FIG. 5c, a top electrode 15 is formed on the ferroelectric film 14. The top electrode 15 is formed of Pt or Au.

Figure 6:
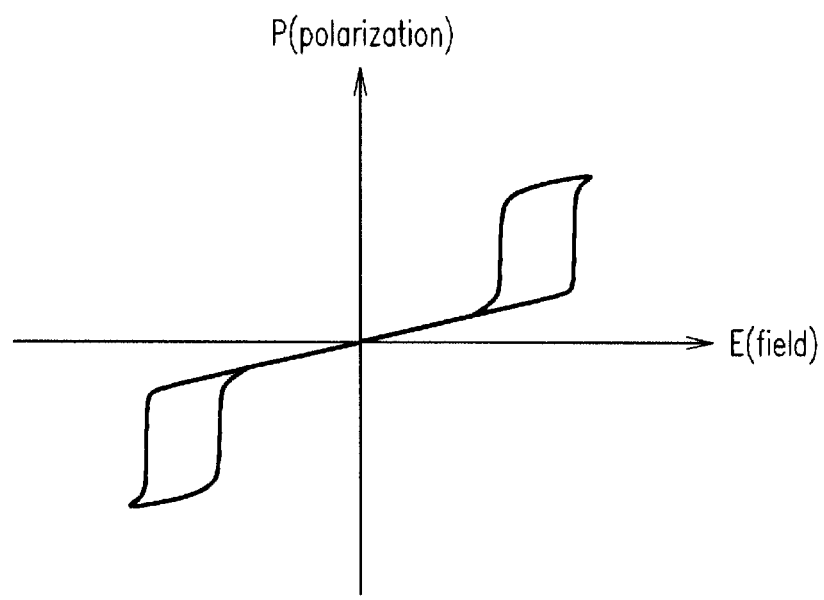
FIG. 6 illustrates a graph showing P-E characteristic of a general antiferroelectric material.
Figure 7:
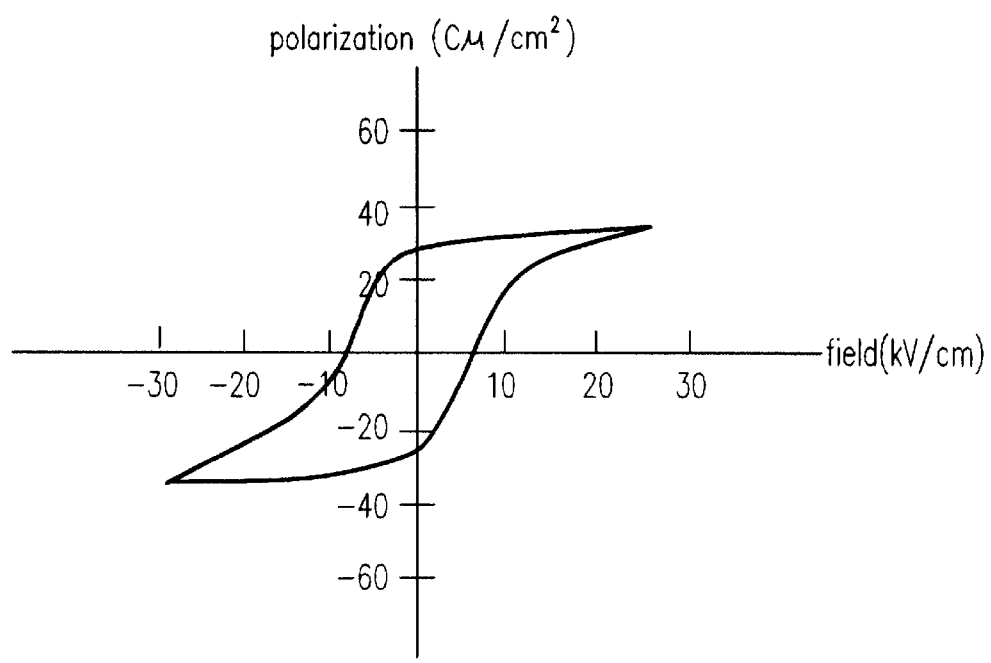
FIG. 7 illustrates a graph showing P-E characteristic of a shape memory antiferroelectric material.

The PNZST, a ferroelectric film of the present invention, will be explained with reference to the attached drawing. FIG. 6 illustrates a graph showing P-E characteristic of a general antiferroelectric material, and FIG. 7 illustrates a graph showing P-E characteristic of a shape memory antiferroelectric material of the memory of the present invention.

Referring to FIG. 6, the aforementioned antiferroelectric film shows a double hysteresis characteristic of a typical antiferroelectric film. That is, upon application of a field to the antiferroelectric film, the antiferroelectric film shows a linear increase of polarization like a paraelectric material up to a certain field intensity at which a state transition to a ferroelectric state is occurred, showing a hysteresis loop identical to a P-E characteristic of a ferroelectric material. And, when the field is removed, since the antiferroelectric film returns to the antiferroelectric state, having no residual dielectric polarization, the antiferroelectric film can not be used for a memory. Of the aforementioned general antiferroelectric materials, there are materials, so called a shape memory ceramics, which maintain a ferroelectric state once induced by a field even after the field is removed if the composition is adjusted appropriately. That is, the graph showing P-E characteristic of a shape memory antiferroelectric material of the present invention shown in FIG. 7 shows a P-E characteristic of a antiferroelectric ceramics with a composition of PNZST of $Pb_{0.99}Nb_{0.02}[(Zr_{0.6}Sn_{0.4})_{1-Y}Ti_Y]_{0.98}O_3$ at a titanium content Y=0.063. For reference, the double hysterisis characteristic shown in FIG. 6 can be obtained when the titanium content Y=0.060. That is, in PNZST, a PNZST with a titanium content 0.065~0.1 and a Zr and Sn ratio of 6:4 is induced into a ferroelectric state, which is only returned to an antiferroelectric filed by heating. And, in the PNZST with a Zr and Sn ratio of 6:4, a PNZST in a range with the titanium content Y≧0.1 shows a ferroelectric state from starting. Thus, by providing a PNZST with a titanium content Y>0.065 while Zr and Sn have a certain ratio, the PNZST can show a P-E characteristic identical to a general ferroelectric material.

Figure 8:
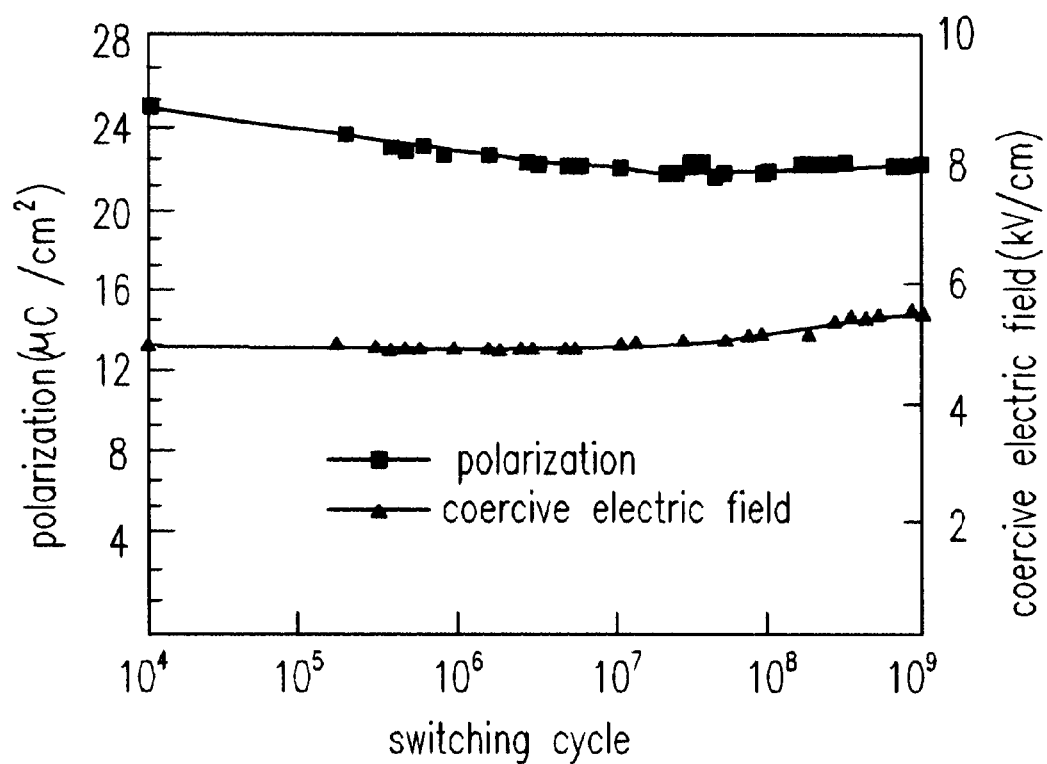
FIG. 8 illustrates a graph showing a fatigue characteristic vs. number of switching cycles of a bulk antiferroelectric material.
Figure 9A:
FIGS. 9a~9b illustrate photographs showing a behaviour of a domain wall when a field is applied to the bulk antiferroelectric material shown in FIG. 8.
Figure 9B:
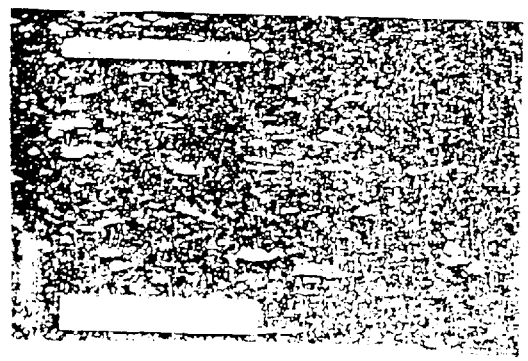

FIG. 8 illustrates a graph showing a fatigue characteristic vs. number of switching cycles of a bulk antiferroelectric material, and FIGS. 9a~9b illustrate photographs showing a behaviour of a domain wall when a field is applied to the bulk antiferroelectric material shown in FIG. 8.

That is, referring to FIG. 8, in general, bulk antiferroelectric material exhibits no fatigue up to a number of switching cycles in a range of $10^9$ times at all, because the polarization inversion of the antiferroelectric material only occurs at 180°. Most of typical ferroelectric films exhibit a polarization inversion at 90°, with a greatest stress caused. On the other hand, the 180° polarization inversion causes almost no stress. Thus, an antiferroelectric film with a 180° polarization inversion shows a fatigue less than a general ferroelectric film. Characteristic of such bulk antiferroelectric film can be known by observing behaviour of a domain wall as shown FIGS. 9a and 9b, wherein it can be known that orientations of the domain wall are the same when electric fields of ±30 kV/cm are applied to the antiferroelectric film for causing polarization inversions as shown in the photographs. This means that a 180° polarization inversion has been occurred in the PNZST.

Figure 10:
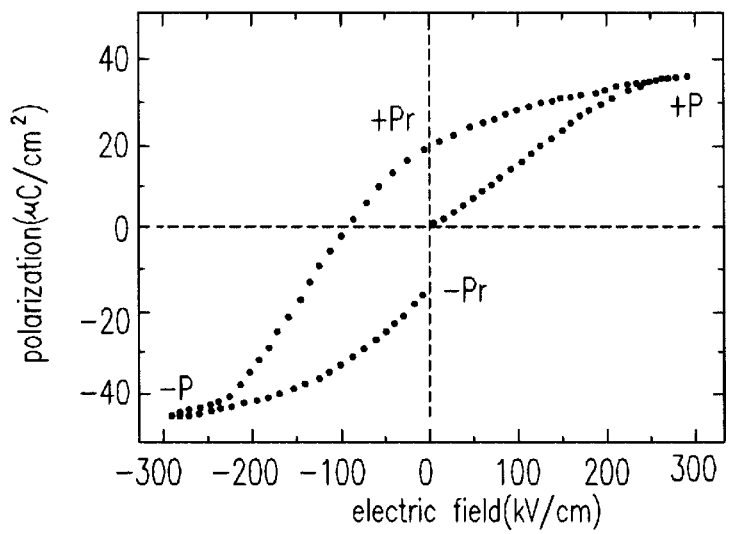
FIG. 10 illustrates a graph showing P-E characteristic of a antiferroelectric material of the present invention.
Figure 11:
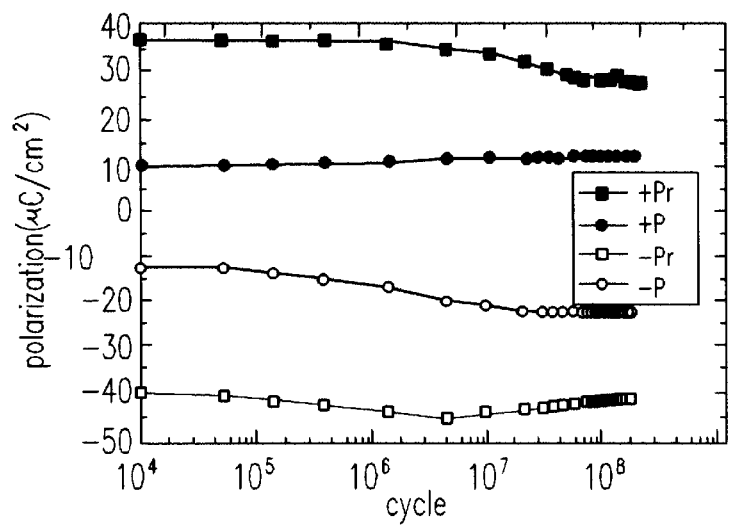
FIG. 11 illustrates a graph showing fatigue characteristic of a antiferroelectric material of the present invention; and, FIG. 12 illustrates a graph showing data retain characteristic of a antiferroelectric material of the present invention.
Figure 12:
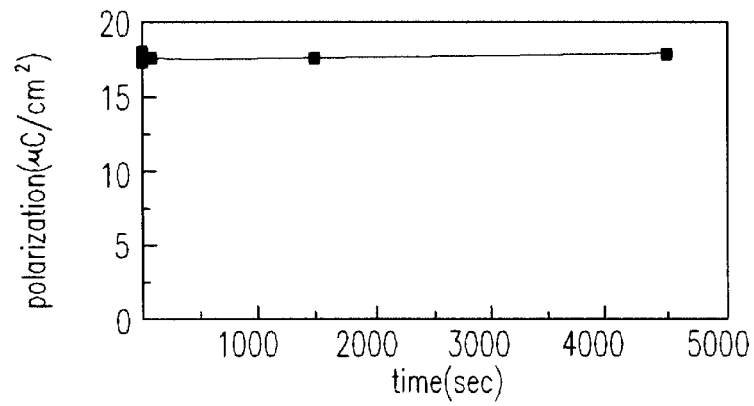

FIG. 10 illustrates a graph showing P-E characteristic of a antiferroelectric material of the present invention, FIG. 11 illustrates a graph showing fatigue characteristic of a antiferroelectric material of the present invention, and FIG. 12 illustrates a graph showing data retain characteristic of a antiferroelectric material of the present invention.

Figure 1A:
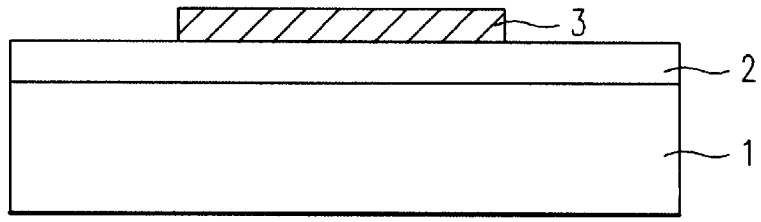
FIGS. 1a~1c illustrate sections showing the steps of a related art method for fabricating a capacitor of a ferroelectric material.
Figure 1B:
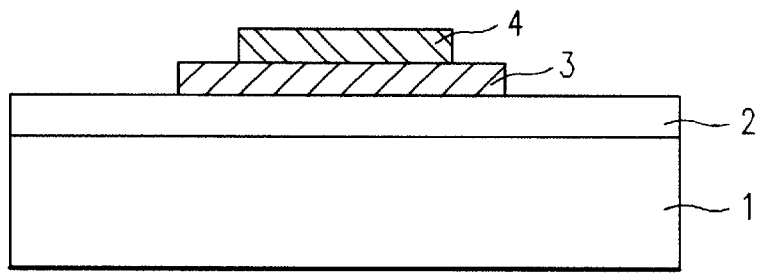
Figure 1C:
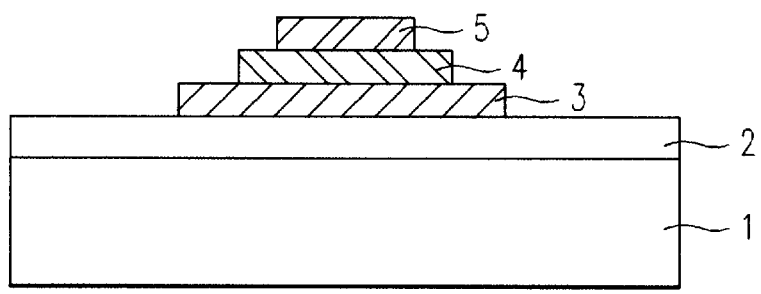
Figure 2:
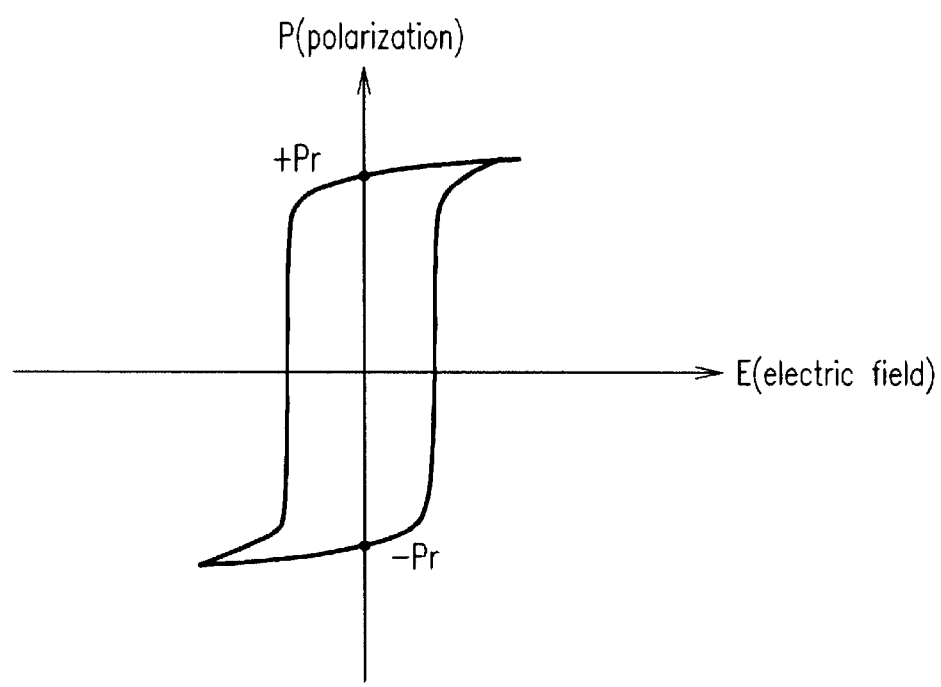
FIG. 2 illustrates a hysteresis loop of a general ferroelectric material.
Figure 3:
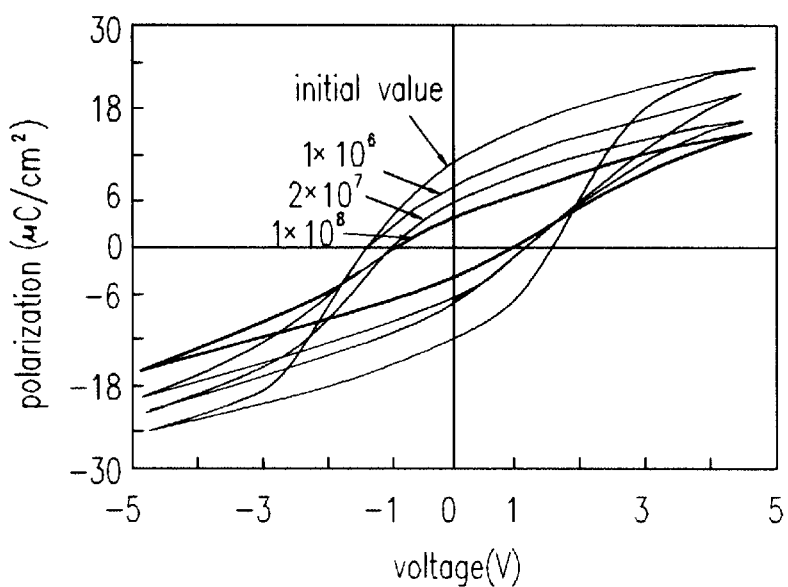
FIG. 3 illustrates a graph showing P-V characteristic of a PZT ferroelectric film on applied field cycle.
Figure 4:
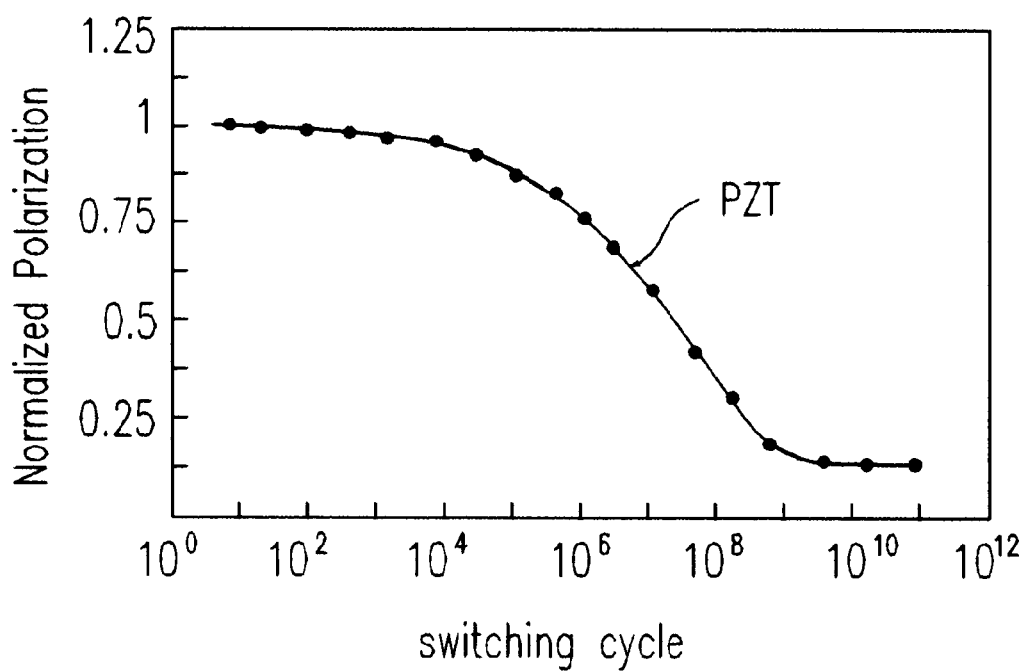
FIG. 4 illustrates a graph showing fatigue of a PZT ferroelectric film.

Referring to FIG. 10, it can be known that a P-E characteristic as shown in FIG. 10 when the titanium content in PbNb($Zr_{0.6}Sn_{0.4}$)$Ti_y$O in FIGS. 8 and 9a~9b is adjusted to 0.1 is similar to a P-E characteristic of a typical ferroelectric material. In this instance, a value of the Pr, a residual dielectric polarization, being 10~20 $\mu$C/cm2 is adequate for use as a memory. While the antiferroelectric film exhibits either a ferroelectric state or an antiferroelectric state depending on an electric field when the titanium content Y=0.060~0.065 and the ratio of Zr and Sn is fixed (6:4), the antiferroelectric film, once turned to a ferroelectric state by an electric field, returns to the antiferroelectric state, not by the electric field again when the titanium content Y$\geq$0.065, but by heating of the film at a temperature ranging 100~200° C. And, referring to FIG. 11, it can be known that the antiferroelectric film of the present invention shows no sign of fatigue even over $10^8$ cycles, which is evident if it is compared to a fatigue of the related art ferroelectric material of PZT. That is, as shown in FIG. 1 1, though the related art ferroelectric film of PZT exhibits a sharp fatigue at $10^8$, the ferroelectric film of the present invention maintains a state the same as an initial state even at $10^8$ cycles(no variation on a residual dielectric polarization). The +P is a polarization when a positive(+) maximum field is applied, +Pr is a polarization when the electric field returns to 0 after application of the positive maximum field, the −P is a polarization when a negative(−) maximum field is applied, and −Pr is a polarization when the electric field returns to 0 after application of the negative maximum field. And, it can be also known that a result of retain test in which a data retain capability is evaluated is excellent as shown in FIG. 12. That is, referring to FIG. 12, a change of a state of data along time is measured after writing the data, wherefrom it can be known that the data is not erased but maintained as it is.

As has been explained, the method for fabricating a nonvolatile ferroelectric memory of the present invention can prolong a life time of the memory and improve a reliability of the memory, because a degradation can be improved by using an antiferroelectric material of 180° polarization inversion.

It will be apparent to those skilled in the art that various modifications and variations can be made in the method for fabricating a nonvolatile ferroelectric memory of the present invention without departing from the spirit or scope of the invention. Thus, it is intended that the present invention cover the modifications and variations of this invention provided they come within the scope of the appended claims and their equivalents.

What is claimed is:

1. A method for fabricating a nonvolatile ferroelectric memory, comprising:

forming an insulating film on a semiconductor substrate;

forming a bottom electrode on the insulating film;

forming a ferroelectric film on the bottom electrode, wherein the ferroelectric film is formed of a material containing zirconium oxide as a base composition, the material having an antiferroelectric phase which can not be induced to a ferroelectric phase by an electric field, and the induced ferroelectric phase exhibiting a hysteresis in polarization-electric field characteristic and unable to be induced to an antiferroelectric phase by an electric field, wherein the ferroelectric film is formed by controlling a composition of PNZST or PZST, wherein the ferroelectric film is formed of the PNZST or PZST, with the ratio of Z and S being 6:4 and a content of T not less than 0.065; and, forming a top electrode on the ferroelectric film.

2. A method as claimed in claim 1, wherein the ferroelectric film is caused to undergo a phase transition from the antiferroelectric phase to the ferroelectric phase by the electric field, with an adjustment of a composition of T while a ratio of Z and S is fixed in the PNZST or PZST.

3. A method as claimed in claim 1, wherein the ferroelectric film is formed of $PbZrO_3$ added with $PbSnO_3$ and $PbTiO_3$.

4. A method as claimed in claim 1, wherein the ferroelectric film is formed by a sol-gel method, MOCVD, or sputtering.

5. A method for fabricating a nonvolatile ferroelectric memory, comprising:

forming an insulating film on a semiconductor substrate;

forming a bottom electrode on the insulating film;

forming a ferroelectric film on the bottom electrode, wherein the ferroelectric film is formed of a material containing zirconium oxide as a base composition, the material having an antiferroelectric phase which can be induced to a ferroelectric phase by heating, and the induced ferroelectric phase exhibiting a hysteresis in polarization-electric field characteristic and unable to be induced to an antiferroelectric phase by an electric field, wherein the ferroelectric film is formed by controlling a composition of PNZST or PZST, wherein the ferroelectric film is formed of the PNZST or PZST, with the ratio of Z and S being 6:4 and a content of T not less than 0.1; and, forming a top electrode on the ferroelectric film.

6. A method as claimed in claim 5, wherein the ferroelectric film is formed of $PbZrO_3$ added with $PbSnO_3$ and $PbTiO_3$.

7. A method as claimed in claim 5, wherein the ferroelectric phase is induced to the antiferroelectric phase at a temperature ranging 100~200° C.

8. A method as claimed in claim 5, wherein the ferroelectric film is formed by a sol-gel method, MOCVD, or sputtering.

9. A method for fabricating a nonvolatile ferroelectric memory, comprising:

forming an insulating film on a semiconductor substrate;

forming a bottom electrode on the insulating film;

forming a ferroelectric film on the bottom electrode, wherein the ferroelectric film is formed of a material containing zirconium oxide as a base composition, wherein the material has a ferroelectric phase at a room temperature, can not be induced to an antiferroelectric phase by an electric field or heating, and exhibits a hysteresis in polarization-electric field characteristic.

10. A method as claimed in claim 9, wherein the ferroelectric film is formed by adding with one selected from lanthanum La, yttrium Y, tantalum Ta, and niobium Nb.

11. The method of claim 1, wherein the content of T not less than 0.1.

12. The method of claim 1, wherein the ferroelectric phase exhibits substantially no fatigue up to a number of switching cycles in a range of approximately $10^9$ times, and wherein the ferroelectric film uses an 180° polarization inversion.

13. The method of claim 1, wherein the material has a ferroelectric phase at a room temperature.

14. The method of claim 1, wherein the ferroelectric phase of the material cannot be induced to an antiferroelectric phase by an electric field or heating.

15. The method of claim 9, wherein the ferroelectric film is formed of a PNZST or PZST, with the ratio of Z and S being 6:4 and a content of T not less than 0.1.

* * * * *